(12) United States Patent  (10) Patent No.: US 7,948,048 B2
Kuroda  (45) Date of Patent: May 24, 2011

(54) SEMICONDUCTOR DEVICE AND METHOD FOR MANUFACTURING SAME

(75) Inventor: Takao Kuroda, Osaka (JP)

(73) Assignee: Panasonic Corporation, Osaka (JP)

(*) Notice: Subject to any disclaimer, the term of this patent is extended or adjusted under 35 U.S.C. 154(b) by 324 days.

(21) Appl. No.: 11/570,658

(22) PCT Filed: Dec. 14, 2005

(86) PCT No.: PCT/JP2005/022920
§ 371 (c)(1),
(2), (4) Date: Dec. 14, 2006

(87) PCT Pub. No.: WO2006/070598
PCT Pub. Date: Jul. 6, 2006

(65) Prior Publication Data
US 2008/0012048 A1  Jan. 17, 2008

(30) Foreign Application Priority Data
Dec. 28, 2004 (JP) .................. 2004-381016

(51) Int. Cl.
H01L 31/06 (2006.01)

(52) U.S. Cl. . 257/461; 257/290; 257/431; 257/E31.084; 257/E21.618; 438/57; 438/217

(58) Field of Classification Search .................. 257/222, 257/392, 396, 402, 403, 191, 192, 225, 290, 257/292, 431, 461, 462, 463, E31.084, E21.618; 438/57, 147, 217, 237, 514
See application file for complete search history.

(56) References Cited

U.S. PATENT DOCUMENTS

| 4,365,261 A | 12/1982 | Chatterjee et al. |
| 4,920,391 A * | 4/1990 | Uchida .......................... 365/149 |
| 4,994,875 A | 2/1991 | Hynecek |
| 5,084,413 A * | 1/1992 | Fujita et al. .................... 438/675 |
| 5,262,661 A | 11/1993 | Kuroda et al. |
| 5,627,388 A | 5/1997 | Shinji |
| 5,675,172 A * | 10/1997 | Miyamoto et al. ............ 257/402 |
| 6,297,113 B1 * | 10/2001 | Kawasaki ...................... 438/305 |
| 6,331,458 B1 * | 12/2001 | Anjum et al. .................. 438/197 |
| 6,784,492 B1 | 8/2004 | Morishita |

(Continued)

FOREIGN PATENT DOCUMENTS
JP  57-7963  1/1982
(Continued)

Primary Examiner — Evan Pert
Assistant Examiner — Eduardo A Rodela
(74) Attorney, Agent, or Firm — Hamre, Schumann, Mueller & Larson, P.C.

(57) ABSTRACT

In a semiconductor device 10 including a structure where transfer electrodes 2a to 2c are disposed on a semiconductor substrate 1 via an insulation layer 3, a first semiconductor region 4 of a first conductivity type, a second semiconductor region 5 of a conductivity type opposite to the first conductivity type, and a third semiconductor region 6 of the first conductivity type in a position that overlaps a region of the semiconductor substrate 1 directly underneath the transfer electrodes 2a to 2c. The second semiconductor region 5 is formed on the first semiconductor region 4. The third semiconductor region 6 is formed on the second semiconductor region 5 so that a position of a maximal point 8 of electric potential of the second semiconductor region 5 when being depleted is deeper than a position of the maximal point 8 in a case where the third semiconductor region 6 does not exist.

18 Claims, 9 Drawing Sheets

U.S. PATENT DOCUMENTS

| | | | |
|---|---|---|---|
| 6,800,529 B2 * | 10/2004 | Kim | 438/289 |
| 6,818,915 B1 * | 11/2004 | Koga | 257/10 |
| 2003/0190788 A1 | 10/2003 | Takagi et al. | |
| 2005/0042793 A1 * | 2/2005 | Mouli et al. | 438/57 |
| 2005/0079667 A1 * | 4/2005 | Iwasaki et al. | 438/232 |
| 2005/0095765 A1 * | 5/2005 | Saiki et al. | 438/197 |

FOREIGN PATENT DOCUMENTS

| | | |
|---|---|---|
| JP | 3-227027 | 10/1991 |
| JP | 4-17341 | 1/1992 |
| JP | 4-218966 | 8/1992 |
| JP | 5-47786 | 2/1993 |
| JP | 5-211331 | 8/1993 |
| JP | 7-86588 | 3/1995 |
| JP | 7-161978 | 6/1995 |
| JP | 7-326739 | 12/1995 |
| JP | 8-153873 | 6/1996 |
| JP | 9-312390 | 12/1997 |
| JP | 2000-174249 | 6/2000 |
| JP | 2001-68674 | 3/2001 |
| JP | 2001-230403 | 8/2001 |
| JP | 2003-60203 | 2/2003 |

* cited by examiner

L-L'

M-M'

SEMICONDUCTOR DEVICE AND METHOD FOR MANUFACTURING SAME

TECHNICAL FIELD

The present invention relates to a semiconductor device, in particular, a charge transfer device and a MOS transistor, and a method for manufacturing the same.

BACKGROUND ART

A charge transfer device represented by a CCD (Charge Coupled Device) and a buried channel-type MOS transistor (a depletion-type MOS transistor) has a structure where an electrode is disposed on a diffusion layer on a surface of a silicon substrate via an insulation layer (for example, see Patent documents 1 to 3). The description below will refer to the figures.

FIG. 9 is a view showing a conventional charge transfer device. FIG. 9A is a cross-sectional view schematically showing a structure of the conventional charge transfer device, FIG. 9B is a view showing an impurity density distribution of the charge transfer device shown in FIG. 9A, and FIG. 9C is a view showing an electric potential distribution of the charge transfer device shown in FIG. 9A.

Each of the distribution diagrams shown in FIGS. 9B and 9C is taken on line Y-Y' of FIG. 9A. Points A, B and C in FIGS. 9B and 9C correspond to points A, B and C on line Y-Y' shown in FIG. 9A, respectively. FIG. 9C shows an electric potential distribution when applying a voltage to a transfer electrode 42b described below and depleting a second semiconductor region 45 underneath the transfer electrode 42b.

The charge transfer device shown in FIG. 9A is a buried channel CCD. As shown in FIG. 9A, the charge transfer device is provided with a semiconductor substrate 41, transfer electrodes 42a to 42c and an insulation layer (a silicon oxide film or the like) 43. The transfer electrodes 42a to 42c are disposed on the semiconductor substrate 41 via the insulation layer 43.

In the semiconductor substrate 41, a p-type first semiconductor region (a p-layer) 44 is formed in a position where the transfer electrodes 42a to 42c overlap the semiconductor substrate 41 in its thickness direction. Moreover, a n-type second semiconductor region (a n-layer) 45 is formed on the first semiconductor region 44. The second semiconductor region 45 is a channel portion of the CCD. Further, pulse voltages are applied to the transfer electrodes 42a to 42c via terminals 46a to 46c, thereby transferring an electric charge.

FIG. 10 is a view showing a conventional buried channel-type MOS transistor. FIG. 10A is a cross-sectional view schematically showing a structure of the conventional buried channel-type MOS transistor, and FIG. 10B is a view showing an electric potential distribution of the buried channel-type MOS transistor shown in FIG. 10A.

Moreover, the electric potential distribution shown in FIG. 10B is taken on line Z-Z' of FIG. 10A. Points A, B and C in FIG. 10B correspond to points A, B and C on line Z-Z' shown in FIG. 10A, respectively.

As shown in FIG. 10, the buried channel-type MOS transistor is formed in the semiconductor substrate 51. In the example shown in FIG. 10, the semiconductor substrate 51 is p-type, and a p-type semiconductor region 54 is formed in the semiconductor substrate 51. Moreover, in the semiconductor substrate 51, n-type semiconductor regions 56 and 57 serving as a source or a drain are formed. Further, between the semiconductor region 56 and the semiconductor region 57, a n-type semiconductor region 55 serving as a channel portion is formed so that a channel is formed even when the voltage applied to a gate is 0 V. The n-type semiconductor region 55 serving as the channel portion has a density lower than those of the n-type semiconductor regions 56 and 57 serving as the source or the drain. Moreover, on the n-type semiconductor region 55, a gate electrode 52 is provided via the gate insulation film 53.

Patent document 1: JP 2001-230403 A (FIG. 2)
Patent document 2: JP 7(1995)-161978 A
Patent document 3: JP 7(1995)-326739 A

DISCLOSURE OF INVENTION

Problem to be Solved by the Invention

In the conventional charge transfer device shown in FIG. 9, an impurity density in the n-type second semiconductor region 45 is highest on a substrate surface of the semiconductor substrate 41, and is lower at a larger depth from the substrate surface of the semiconductor substrate 41, as shown in FIG. 9B. In this case, since an electric field in a direction perpendicular to the substrate surface is high in a position where the impurity density is high (that is, on the substrate surface), a potential gradient between the transfer electrodes 42a to 42c and the second semiconductor region 45 (between A and B) is high, as shown in FIG. 9C.

Thus, as shown in FIG. 9C, the electric potential in the second semiconductor region 45 is maximal at a small depth from the substrate surface, that is, in the vicinity of an interface (the point B) between the insulation layer 43 and the semiconductor substrate 41. Reference numeral 48 denotes a maximal point of the electric potential. As a result, the electric charge is accumulated in the vicinity of this interface, and the accumulated electric charge is transferred in the vicinity of this interface.

However, in general, when the maximal point 48 exists at such a small depth from the substrate surface, a so-called fringing field is weak. Thus, in the conventional charge transfer device shown in FIG. 9, the transfer efficiency may be decreased.

Whereas, considering the point that the impurity density is higher at the smaller depth from the substrate surface, increasing a diffusion depth of the n-type second semiconductor region 45 itself is exemplified as a method for solving the decrease of the transfer efficiency. However, when increasing the diffusion depth of the second semiconductor region 45, there occurs a new problem in that, unless the impurity density of the second semiconductor region 45 is low, the maximal electric potential is increased so as to cause the inconvenience of the operation. Moreover, when decreasing the impurity density of the second semiconductor region 45, there occurs a new problem in that the maximum transfer charge amount of the buried channel CCD is decreased, because it is determined by the impurity density of the second semiconductor region 45.

Also, in the conventional buried channel-type MOS transistor shown in FIG. 10, the electric potential in the n-type semiconductor region 55 serving as the channel portion is maximal on an interface (at the point B) between the semiconductor substrate 51 and the gate insulation film 53 (a maximal point 58), as shown in FIG. 10B. Thus, also in the n-type semiconductor region 55, the electric charge is accumulated in the vicinity of the interface between the semiconductor substrate and the insulation layer including the interface itself, and is transferred in the vicinity of the interface. Moreover, in the buried channel-type MOS transistor, there are various levels for capturing or releasing the passing electric charge on the interface between the semiconductor substrate 51 and the gate insulation film 53. Thus, the conventional buried channel-type MOS transistor shown in FIG. 10 has a problem in that noises are generated due to the accumulation and the transition of the electric charge in the vicinity of the interface.

It is the object of the present invention is to solve the problems described above, and to provide a semiconductor device with suppressed accumulation and transition of an electric charge in the vicinity of an interface between a semiconductor substrate and an insulation layer including the interface itself, and a method for manufacturing the same.

Means for Solving Problem

In order to attain the above-described object, the semiconductor device of the present invention is a semiconductor device including a structure where an electrode is disposed on a semiconductor substrate via an insulation layer, wherein the semiconductor substrate includes: a first semiconductor region of a first conductivity type; a second semiconductor region of a conductivity type opposite to the first conductivity type; and a third semiconductor region of the first conductivity type in a position that overlaps a region of the semiconductor substrate directly underneath the electrode. The second semiconductor region is formed on the first semiconductor region, and the third semiconductor region is formed on the second semiconductor region so that a position of a maximal point of electric potential of the second semiconductor region when being depleted is deeper than a position of the maximal point in a case where the third semiconductor region does not exist.

In order to attain the above-described object, the method for manufacturing the semiconductor device of the present invention is a method for manufacturing a semiconductor device including a structure where an electrode is disposed on a semiconductor substrate via an insulation layer, the method at least including: (a) a step of introducing an impurity of a first conductivity type into a region that overlaps a region on the semiconductor substrate directly underneath the electrode so as to form a first semiconductor region; (b) a step of introducing an impurity of a conductivity type opposite to the first conductivity type into a region that overlaps a region on the first semiconductor region directly underneath the electrode so as to form a second semiconductor region; and (c) a step of introducing an impurity of the first conductivity type into a region that overlaps a region on the second semiconductor region directly underneath the electrode so as to form a third semiconductor region, wherein the introduction of the impurity of the first conductivity type in the step (c) is carried out for the formed third semiconductor region so that a position of a maximal point of electric potential of the second semiconductor region when being depleted is deeper than a position of the maximal point in a case where the third semiconductor region does not exist.

Effects of the Invention

As described above, according to the solid-state imaging device of the present invention and the method for manufacturing the same, the third semiconductor region of the conductivity type opposite to the conductivity type of the second semiconductor region is formed on the second semiconductor region. Thus, when applying a voltage to the electrode and depleting the second semiconductor region directly underneath the electrode, the maximal point of the electric potential is at a depth larger than that of the conventional example in which the third semiconductor region does not exist (see FIGS. 9 and 10).

Thus, the accumulation of the electric charge at the interface between the semiconductor substrate and the insulation layer and in the vicinity of the interface can be suppressed. Therefore, in the case of applying the semiconductor device of the present invention to the charge transfer device, the decrease of the transfer charge amount can be prevented, and the decrease of the transfer efficiency can be suppressed. Moreover, in the case of applying the semiconductor device of the present invention to the MOS transistor, the generation of noises can be suppressed.

BRIEF DESCRIPTION OF DRAWINGS

FIG. 1 is a plan view showing a semiconductor device according to Embodiment 1 of the present invention.

FIG. 2 is a view showing the semiconductor device according to Embodiment 1 of the present invention.

FIG. 5 is a cross-sectional view showing a method for manufacturing the semiconductor device according to Embodiment 1 of the present invention.

FIG. 6 is a cross-sectional view showing the method for manufacturing the semiconductor device according to Embodiment 1 of the present invention.

FIG. 7 is a view showing a semiconductor device according to Embodiment 2 of the present invention.

FIG. 8 is a cross-sectional view showing a method for manufacturing the semiconductor device according to Embodiment 2 of the present invention.

FIG. 9 is a view showing a conventional charge transfer device.

FIG. 10 is a view showing a conventional buried channel-type MOS transistor.

DESCRIPTION OF THE INVENTION

Figure 1A:
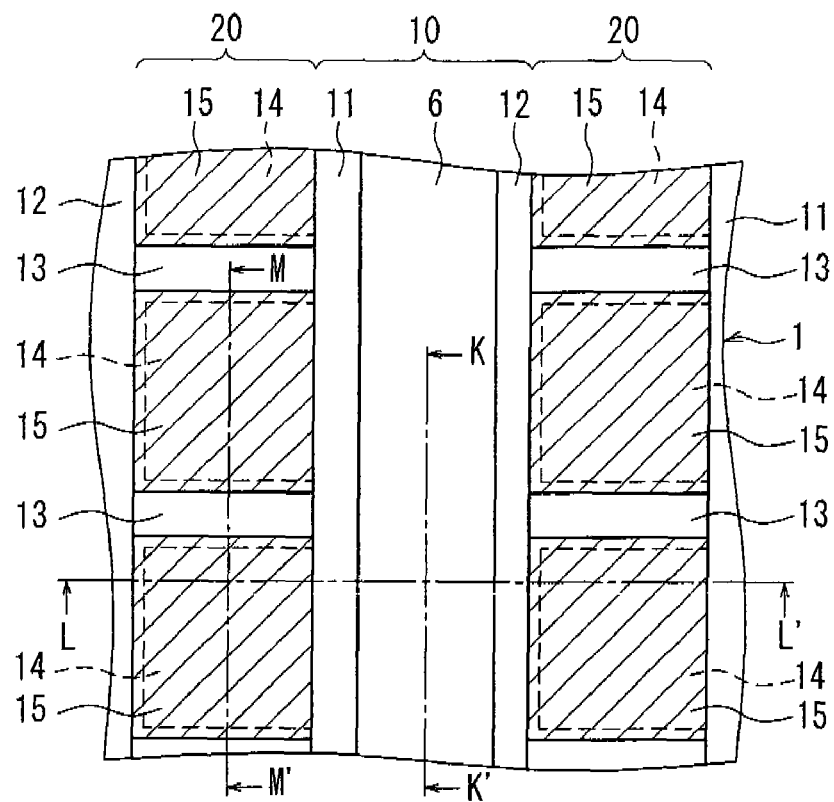
FIG. 1A is a view in which a transfer electrode is not shown.

The semiconductor device of the present invention is a semiconductor device including a structure where an electrode is disposed on a semiconductor substrate via an insulation layer, wherein the semiconductor substrate includes: a first semiconductor region of a first conductivity type; a second semiconductor region of a conductivity type opposite to the first conductivity type; and a third semiconductor region of the first conductivity type in a position that overlaps a region of the semiconductor substrate directly underneath the electrode. The second semiconductor region is formed on the first semiconductor region, and the third semiconductor region is formed on the second semiconductor region so that a position of a maximal point of electric potential of the second semiconductor region when being depleted is deeper than a position of the maximal point in a case where the third semiconductor region does not exist. In the above-described semiconductor device of the present invention, the second semiconductor region and the third semiconductor region are depleted by an application of a voltage to the electrode.

In the above-described semiconductor device of the present invention, it is preferable that the third semiconductor region is a p-type region in which at least one of indium, gallium and thallium is introduced. Further, it is more preferable that the second semiconductor region is a n-type region in which arsenic is introduced. In these cases, diffusion of the impurity in the semiconductor region by heat can be suppressed.

Moreover, the above-described semiconductor device of the present invention may be a charge transfer device. In this case, the second semiconductor region functions as a channel portion of the charge transfer device, and a plurality of the electrodes exist and function as transfer electrodes of the charge transfer device.

Further, the above-described semiconductor device of the present invention also may be a MOS transistor. In this case, the second semiconductor region functions as a channel portion of the MOS transistor, the electrode functions as a gate electrode of the MOS transistor, and a semiconductor region serving as a source region of the MOS transistor and a semiconductor region serving as a drain of the MOS transistor are formed in positions that are adjacent to the second semiconductor region and the third semiconductor region.

The method for manufacturing the semiconductor device of the present invention is a method for manufacturing a semiconductor device including a structure where an electrode is disposed on a semiconductor substrate via an insulation layer, the method at least including: (a) a step of introducing an impurity of a first conductivity type into a region that overlaps a region on the semiconductor substrate directly underneath the electrode so as to form a first semiconductor region; (b) a step of introducing an impurity of a conductivity type opposite to the first conductivity type into a region that overlaps a region on the first semiconductor region directly underneath the electrode so as to form a second semiconductor region; and (c) a step of introducing an impurity of the first conductivity type into a region that overlaps a region on the second semiconductor region directly underneath the electrode so as to form a third semiconductor region, wherein the introduction of the impurity of the first conductivity type in the step (c) is carried out for the formed third semiconductor region so that a position of a maximal point of electric potential of the second semiconductor region when being depleted is deeper than a position of the maximal point in a case where the third semiconductor region does not exist.

Moreover, in the above-described method for manufacturing the semiconductor device of the present invention, it is preferable that the introduction of the impurity of the first conductivity type in the step (c) is carried out by ion-implantation, and an acceleration energy is set in a range between 50 keV and 200 keV, and a dose is set in a range between $5 \times 10^{11}$ ions/cm$^2$ and $8 \times 10^{12}$ ions/cm$^2$, during the ion-implantation. In the case of forming the third semiconductor region under such a condition, the position of the maximal point of the electric potential of the second semiconductor region when being depleted reliably can be deeper than that in the case where the third semiconductor region does not exist.

In the above-described method for manufacturing the semiconductor device of the present invention, it is preferable that the impurity of the first conductivity type in the step (c) is at least one of indium, gallium and thallium. Further, it is preferable that the impurity of the conductivity type opposite to the first conductivity type in the step (b) is arsenic. In such cases, the diffusion of the impurity in the semiconductor region by heat can be suppressed.

Also, the impurity may be ionized into either a bivalent ion or a monovalent ion in the ion-implantation in the step (c). In the case of ionizing the impurity into a monovalent ion, a relatively high acceleration energy (keV) is required, but the accelerated ion is fractionated easily. Thus, mixing of impurity ions that are not to be implanted can be suppressed during the ion-implantation, and thus the ion-implantation can be achieved at a high purity. Whereas, in the case of ionizing the impurity into a bivalent ion, the ion-implantation can be achieved at a relatively low acceleration energy (keV).

Moreover, in the above-described method for manufacturing the semiconductor device of the present invention, it is preferable further to include a step of heating the semiconductor substrate after the ion-implantation in the step (c). In this case, the diffusion of the impurity that is implanted by the ion-implantation can be suppressed more.

Embodiment 1

A semiconductor device according to Embodiment 1 of the present invention and a method for manufacturing the semiconductor device will be described below with reference to FIGS. 1 to 6. The semiconductor device according to Embodiment 1 is a charge transfer device called a buried channel CCD, and constitutes a part of a solid-state imaging device.

Figure 1B:
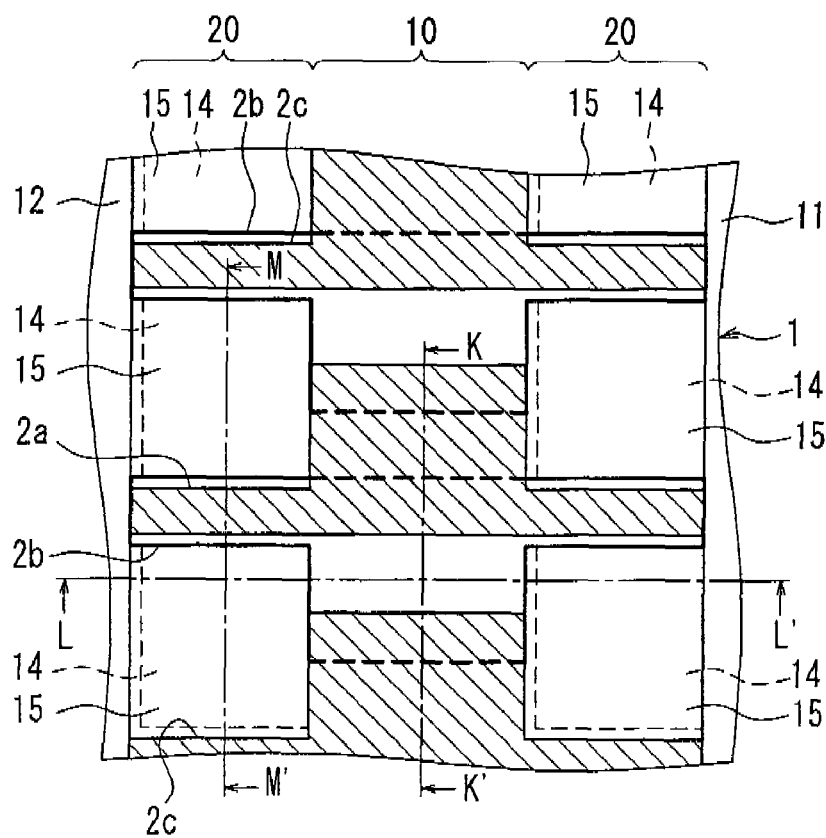
FIG. 1B is a view in which the transfer electrode is shown.

FIG. 1 is a plan view showing the semiconductor device according to Embodiment 1 of the present invention. FIG. 1A is a view in which a transfer electrode is not shown, and FIG. 1B is a view in which the transfer electrode is shown. FIG. 1 also shows a solid-state imaging device including the semiconductor device. Moreover, a semiconductor region 15 in FIG. 1A and transfer electrodes 2a and 2c in FIG. 1B are hatched.

Figure 2A:
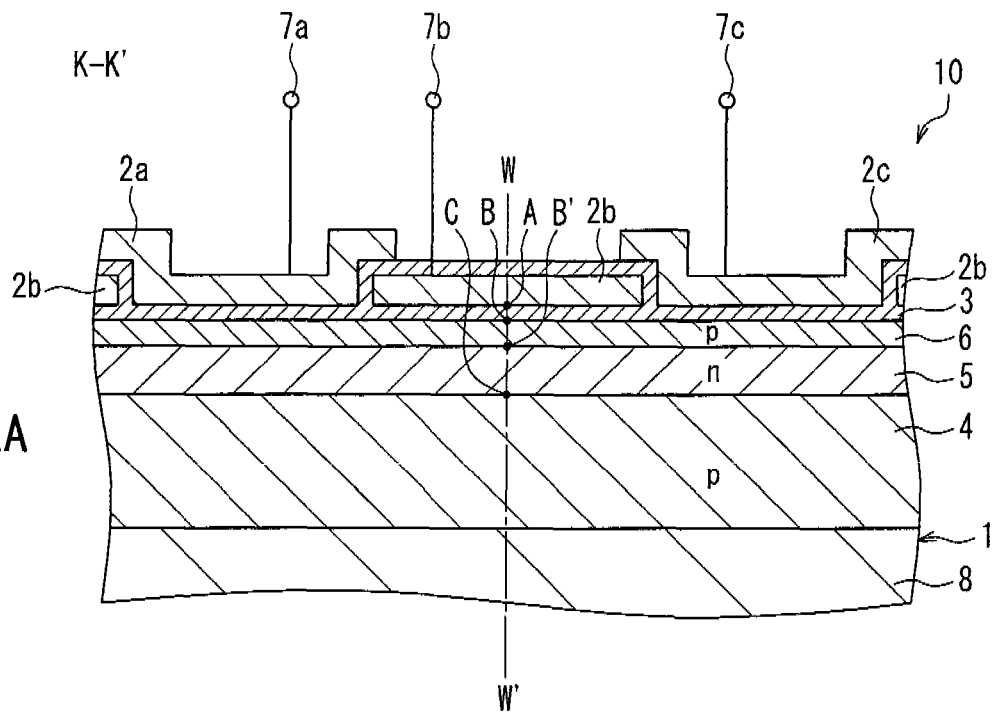
FIG. 2A is an enlarged cross-sectional view showing a structure of the semiconductor device according to Embodiment 1.
Figure 2B:
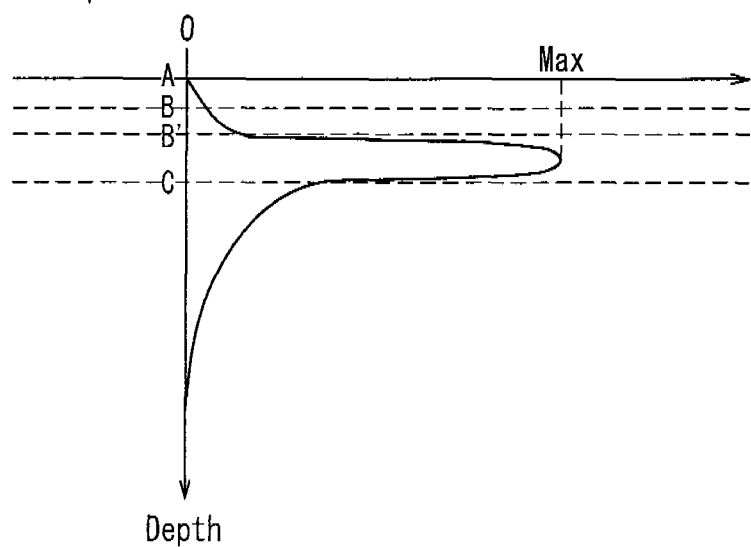
FIG. 2B is a view showing an electric potential distribution of the semiconductor device shown in FIG. 2A.

FIG. 2 is a view showing the semiconductor device according to Embodiment 1 of the present invention. FIG. 2A is an enlarged cross-sectional view showing a structure of the semiconductor device according to Embodiment 1, and FIG. 2B is a view showing an electric potential distribution of the semiconductor device shown in FIG. 2A. The cross-section shown in FIG. 2A is taken on line K-K' of FIGS. 1A and 1B. The electric potential distribution shown in FIG. 2B is taken on line W-W' of FIG. 2A. Moreover, points A, B, B' and C in FIG. 2B correspond to points A, B, B' and C on line W-W' shown in FIG. 2A, respectively.

Figure 3:
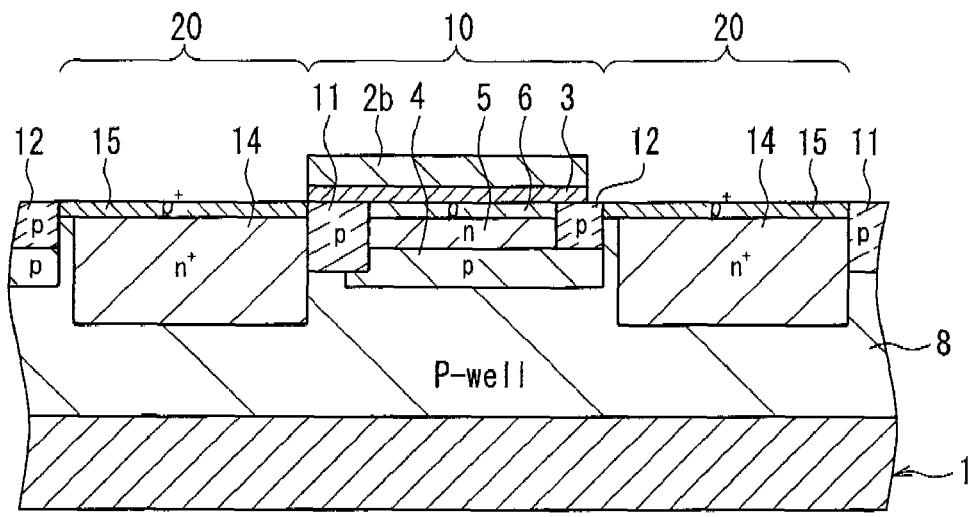
FIG. 3 is a cross-sectional view showing the structure of the semiconductor device (a charge transfer device) according to Embodiment 1 of the present invention, and also showing a solid-state imaging device including the semiconductor device.
Figure 4:
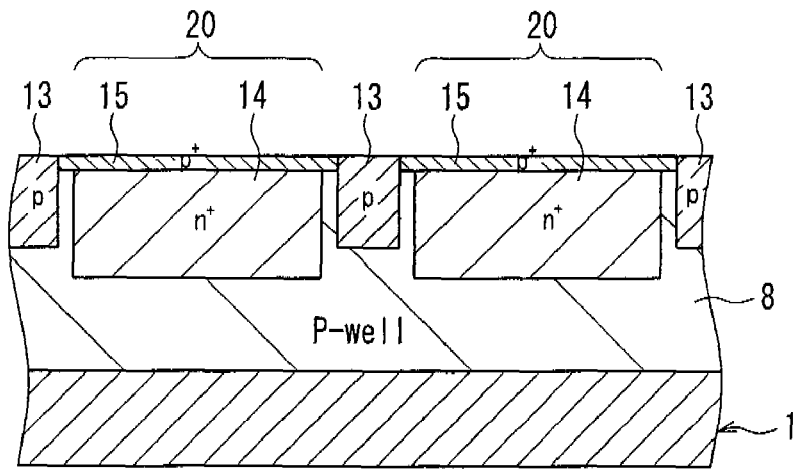
FIG. 4 is a cross-sectional view showing a structure of the solid-state imaging device including the semiconductor device according to Embodiment 1 of the present invention.

FIG. 3 is a cross-sectional view showing the structure of the semiconductor device according to Embodiment 1 of the present invention, and also showing a solid-state imaging device including the semiconductor device. The cross-section shown in FIG. 3 is taken on line L-L' of FIGS. 1A and 1B. FIG. 4 is a cross-sectional view showing a structure of the solid-state imaging device including the semiconductor device according to Embodiment 1 of the present invention. The cross-section shown in FIG. 4 is taken on line M-M' of FIGS. 1A and 1B.

Firstly, the structure of the solid-state imaging device provided with the semiconductor device according to Embodiment 1 will be described. As shown in FIGS. 1A, 1B and 3, the semiconductor device (the charge transfer device) 10 according to Embodiment 1 is a vertical CCD constituting a part of the solid-state imaging device. The solid-state imaging device is provided with a semiconductor substrate 1 in which a photodiode 20 and the semiconductor device 10 are formed. In Embodiment 1, the semiconductor substrate 1 is a n-type silicon substrate. In the semiconductor substrate, a p-well 8 is formed.

As shown in FIG. 3, the photodiode 20 is provided with a photoelectric conversion region 14 formed on the p-well 8, and a p-type semiconductor region (a p-layer) 15 formed on the photoelectric conversion region 14. The photoelectric conversion region 14 is an n-type semiconductor region (a n-layer). Moreover, a plurality of the photodiodes 20 are formed on the semiconductor substrate 1. The plurality of the photodiodes 20 are arranged in matrix, and each of the photodiodes 20 constitutes a unit pixel.

Moreover, as shown in FIGS. 1A and 4, element isolation regions 13 are formed between the photodiodes 20 that are adjacent one another in a vertical direction (a longitudinal direction of FIG. 1). In Embodiment 1, the element isolation region 13 is a p-type semiconductor region.

Further, as shown in FIGS. 1A, 1B and 3, the semiconductor device 10 is the vertical CCD as described above, and thus is arranged along a column of each of the plurality of the photodiodes 20 that are aligned in the vertical direction. Also, element isolation regions 11 and 12 are formed between the semiconductor device 10 and the vertical column of the photodiode 20. It should be noted that, in Embodiment, an electric charge accumulated in the photodiode 20 is transferred to the semiconductor device 10 via the element isolation region 11.

Next, the structure of the semiconductor device according to Embodiment 1 will be described. As shown in FIGS. 1B, 2A and 3, the semiconductor device (the charge transfer device) 10 of Embodiment 1 has a structure where the transfer electrodes 2a to 2c are disposed on the semiconductor substrate 1 via an insulation layer 3. In FIGS. 1B and 2A, only a part of each transfer electrode is shown, but actually, a multiplicity of the transfer electrodes according to the number of pixels are arranged along a transferring direction (see FIG. 1). Reference numerals 7a to 7c denote terminals for applying pulse voltages to the respective transfer electrodes 2a to 2c.

Moreover, as shown in FIGS. 2A and 3, the semiconductor substrate 1 is provided with a p-type first semiconductor region (a p-layer) 4, a n-type second semiconductor region (a n-layer) 5 and a p-type third semiconductor region (a p-layer) 6 in a position that overlaps a region of the semiconductor substrate 1 directly underneath the transfer electrodes 2a to 2c. The second semiconductor region 5 is formed on the first semiconductor region 4, and functions as a channel portion of the CCD. Further, the third semiconductor region 6 is formed on the second semiconductor region 5.

Figure 9A:
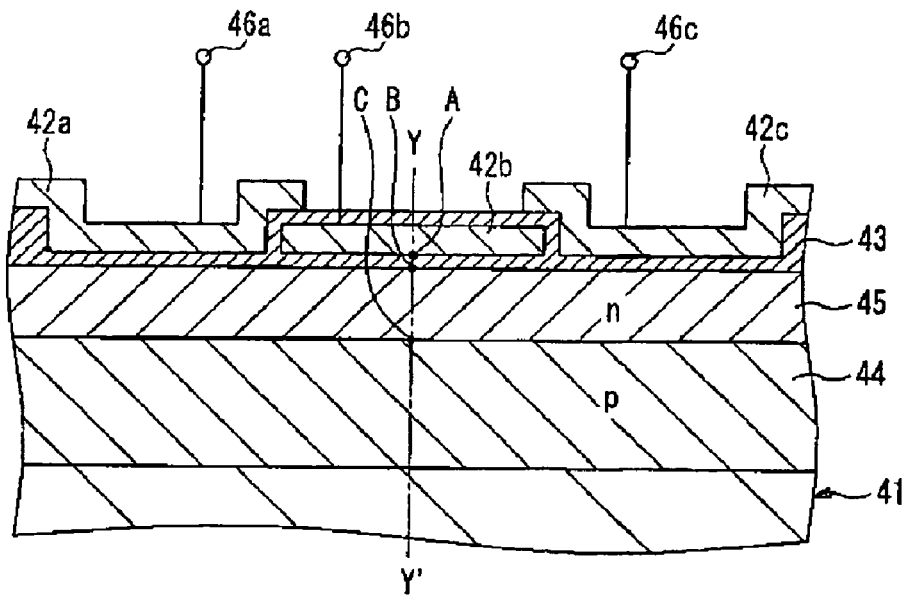
FIG. 9A is a cross-sectional view schematically showing a structure of the conventional charge transfer device.

Here, the semiconductor device of the conventional example shown in FIG. 9 in Background Art and the semiconductor device of Embodiment 1 will be compared. As shown in FIGS. 2 and 9, the third semiconductor region 6 that does not exist in the conventional example is formed as a surface layer of the semiconductor substrate 1 in Embodiment 1. Moreover, a conductivity type of the third semiconductor region 6 is a conductivity type opposite to the conductivity type of the second semiconductor region 5.

Thus, when applying the voltage to the transfer electrode 2b and depleting the second semiconductor region 5 and the third semiconductor region 6, an electric field on a substrate surface of the semiconductor substrate 1 in a direction perpendicular to the substrate surface is weaker than that of the conventional example, due to the existence of the third semiconductor region 6. Thus, as shown in FIG. 2B, a potential gradient between the transfer electrodes 2a to 2c and the second semiconductor region 5 (between A and B') is lower than that of the conventional example (see FIG. 9C). Also, an electric potential on an interface between the substrate surface of the semiconductor substrate 1 and the insulation layer 3 is lower than that of the conventional example.

Figure 9B:
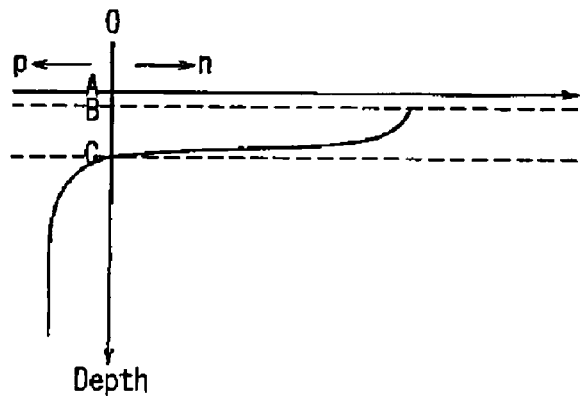
FIG. 9B is a view showing an impurity density distribution of the charge transfer device shown in FIG. 9A.
Figure 9C:
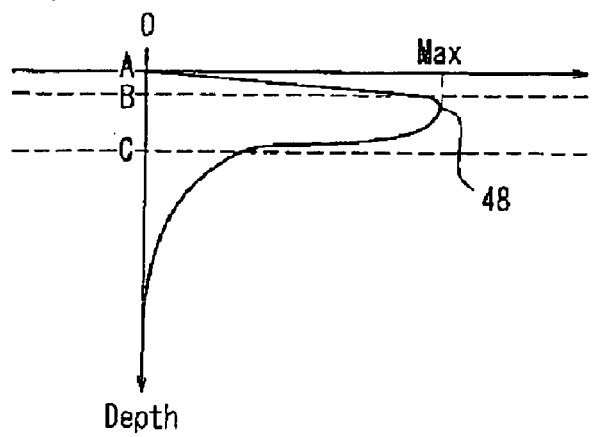
FIG. 9C is a view showing an electric potential distribution of the charge transfer device shown in FIG. 9A.

As a result, a position of a maximal point of electric potential of the second semiconductor region 5 when being depleted is deeper than that of the conventional example in which the third semiconductor region 6 does not exist (see FIG. 9B). Thus, according to Embodiment 1, since a fringing field is stronger, and a transfer charge is accumulated at a depth larger than that of the conventional example, a transfer efficiency of the charge transfer device can be improved, compared with the conventional example.

Moreover, as a result, since a diffusion depth of the second semiconductor region 5 serving as the channel portion of the CCD is not required to be increased for improving the transfer efficiency (see Background Art), the inconvenience of the operation can be suppressed. Further, an impurity density of the second semiconductor region 5 also is not required to be decreased (see Background Art), so that the decrease of the transfer charge amount also can be suppressed.

Moreover, in order to deepen the position of the maximal point (see FIG. 2B) of the electric potential in the second semiconductor region 5 more than that of the conventional example, it is necessary to secure a certain impurity density in the third semiconductor region 6. Thus, the impurity preferably is introduced by ion-implantation for forming the third semiconductor region 6. Further, it is preferable that, during the ion-implantation, an acceleration energy is set in a range between 50 keV and 200 keV, and a dose is set in a range between $5 \times 10^{11}$ ions/cm$^2$ and $8 \times 10^{12}$ ions/cm$^2$, for example. Moreover, since the semiconductor device of Embodiment 1 is the charge transfer device, it is particularly preferable that the acceleration energy is set in a range between 60 keV and 150 keV, and the dose is set in a range between $1 \times 10^{12}$ ions/cm$^2$ and $8 \times 10^{12}$ ions/cm$^2$ during the ion-implantation.

Further, in the light of suppressing the decrease of the transfer charge amount, it is preferable to form the third semiconductor region 6 in the vicinity of the interface between the semiconductor substrate 1 and the insulation layer 3 so as to be as shallow as possible (so as to have a space as thin as possible). However, in the case of forming the third semiconductor region 6 so as to be shallow, the impurity in the third semiconductor region 6 is likely to be diffused into the second semiconductor region 5 by heat generated in the process of manufacturing the semiconductor device 10. Thus, the third semiconductor region 6 is preferably formed by using, as the impurity, a material that has a relatively large atomic radius and has a low speed of diffusion induced by heat. Examples of the impurity include indium (In), gallium (Ga) and thallium (Tl).

Moreover, the ion-implantation of the impurity such as indium (In), gallium (Ga) and thallium (Tl) during the formation of the third semiconductor region 6 may be carried out by ionizing the impurity into a monovalent ion or a bivalent ion.

For example, in the case of ionizing the impurity into a monovalent ion, a relatively high acceleration energy (keV) is required, but the accelerated ion is fractionated easily. Thus, mixing of impurity ions that are not to be implanted can be suppressed during the ion-implantation, and thus the ion-implantation can be achieved at a high purity. Whereas, in the case of ionizing the impurity into a bivalent ion, the ion-implantation can be achieved at a relatively low acceleration energy (keV).

Moreover, the materials such as indium (In), gallium (Ga) and thallium (Tl) that have relatively large atomic radiuses and have low speeds of diffusion induced by heat are effective also as an impurity for forming a p-type semiconductor region except for the third semiconductor region 6.

For example, as shown in FIGS. 1A and 3, in the photodiode 20 of the solid-state imaging device, a p-type semiconductor region 15 is formed as an upper layer of the photoelectric conversion region 14. The p-type semiconductor region 15 is a high-density impurity layer, and is formed for suppressing a dark current generated on the interface. In addition, the semiconductor region 15 preferably is formed so as to be shallow. The reason for this is because, as an area of an overlap in a thickness direction of the semiconductor substrate 1 between a region where the p-type impurity is distributed in the semiconductor region 15 and a region where the n-type impurity is distributed in the photoelectric conversion region 14 is smaller, saturation characteristics can be improved more, that is, a charge amount accumulated in the photoelectric conversion region 14 can be increased more, and generation of so-called white flaws can be suppressed more (see JP 4(1992)-218966 A).

However, the impurity that exists in the semiconductor region 15 may be diffused into the photoelectric conversion region 14 by heat generated in the manufacturing process, similarly to the impurity in the third semiconductor region 6. In this case, the area of the overlap in the thickness direction of the semiconductor substrate 1 is increased. Thus, also for the formation of the semiconductor region 15, it is preferable to use, as the impurity, the materials such as indium (In), gallium (Ga) and thallium (Tl) that have relatively large atomic radiuses and have low speeds of diffusion induced by heat.

Moreover, as described above, the element isolation regions 11 and 12 shown in FIGS. 1A and 3, and the element isolation region 13 shown in FIGS. 1 and 4 are semiconductor regions formed by introducing the p-type impurities. Thus, the impurities in the element isolation regions 11 to 13 also may be diffused by the heat generated in the manufacturing process, similarly to the impurity in the third semiconductor region 6.

Further, when the impurities in the element isolation regions 11 to 13 are diffused, the second semiconductor region 5 serving as the channel portion of the vertical CCD and the photoelectric conversion region 14 that are around the element isolation regions 11 to 13 are narrowed by the diffused impurities. Moreover, in this case, saturation characteristics of these regions are degraded, that is, the maximum charge amount that can be carried in these regions is decreased.

Thus, also for the formation of the element isolation regions 11 to 13, it is preferable to use, as the impurity, the materials such as indium (In), gallium (Ga) and thallium (Tl) that have relatively large atomic radiuses and have low speeds of diffusion induced by heat.

Moreover, in Embodiment 1, the diffusion of the n-type impurity by heat is preferably suppressed also in the n-type second semiconductor region 5 and the n-type photoelectric conversion region 14. The reason for this is because, even if the diffusion of the p-type impurity by heat is suppressed, when the n-type impurity is diffused significantly by the heat, a diffusion depth (that is, xj) is increased, which causes a problem in that the channel electric potential is increased so as to prevent a normal operation, and as a result, the function as the charge transfer device is degraded. Incidentally, instead of suppressing the diffusion of the n-type impurity by heat, a method of decreasing the impurity density in advance so that the channel electric potential may be proper after being heated is also possible. However, in this case, there occurs a new problem of decreasing a charge amount that can be transferred. Thus, it is preferable to use, also as the n-type impurity, a material that has a relatively large atomic radius and has a low speed of diffusion induced by heat. For example, arsenic (As) may be used.

Figure 5A:
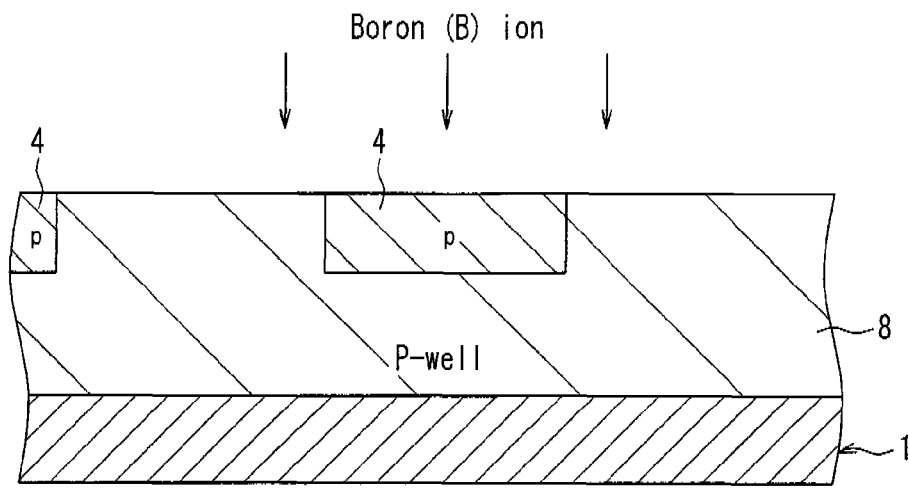
FIGS. 5A to 5C show a series of main manufacturing steps.
Figure 5B:
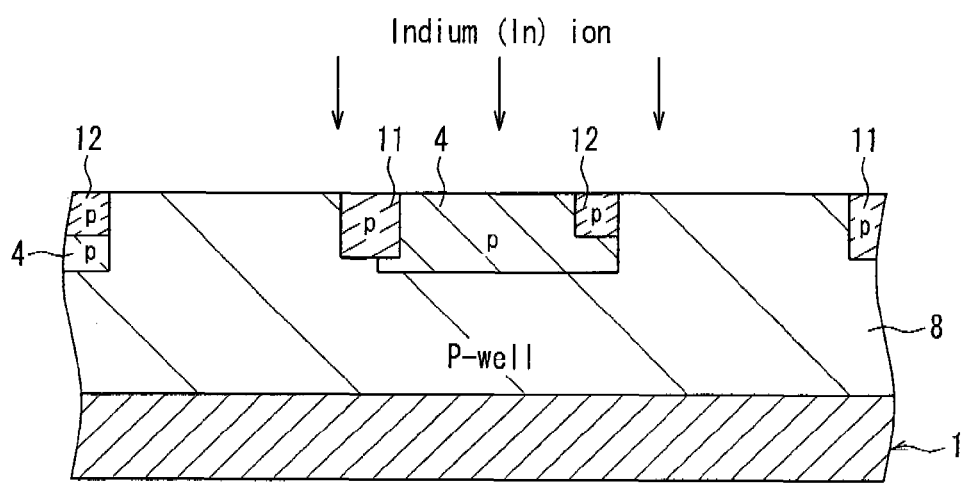
Figure 5C:
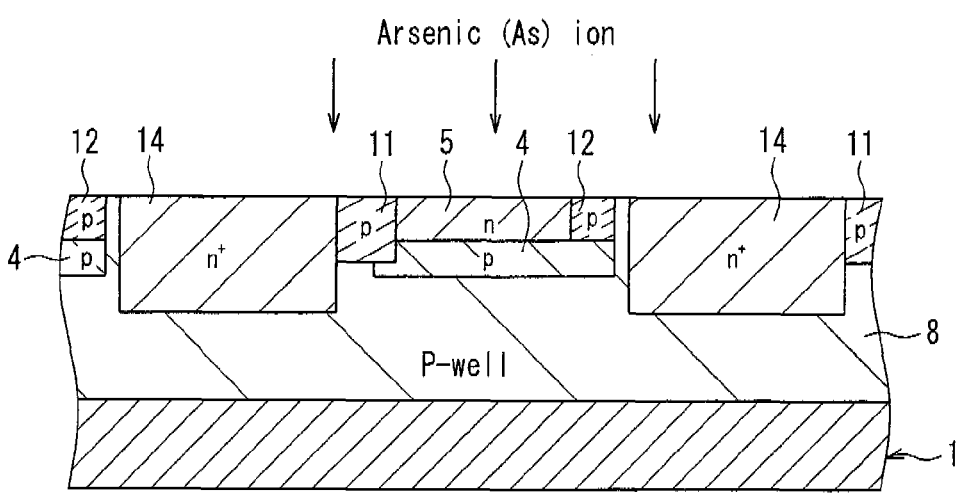
Figure 6A:
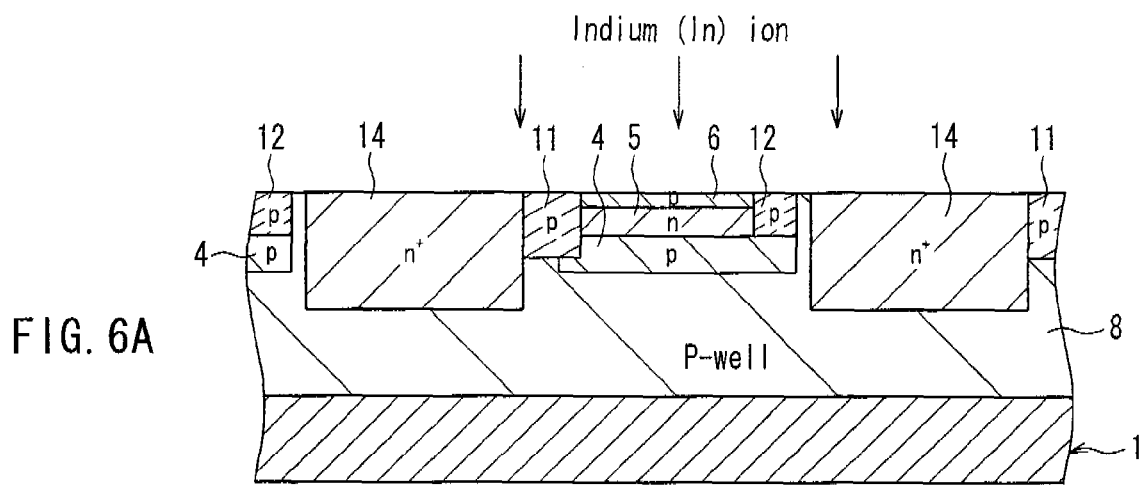
FIGS. 6A to 6C show a series of main manufacturing steps that are performed after the step shown in FIG. 5C.
Figure 6B:
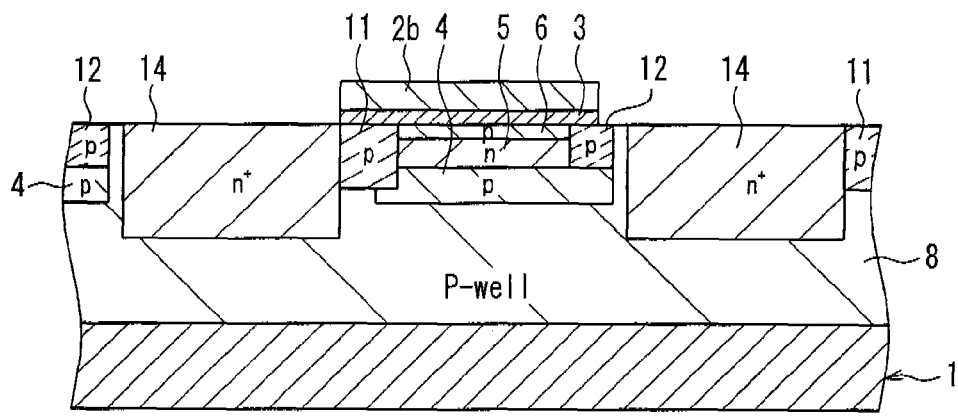
Figure 6C:
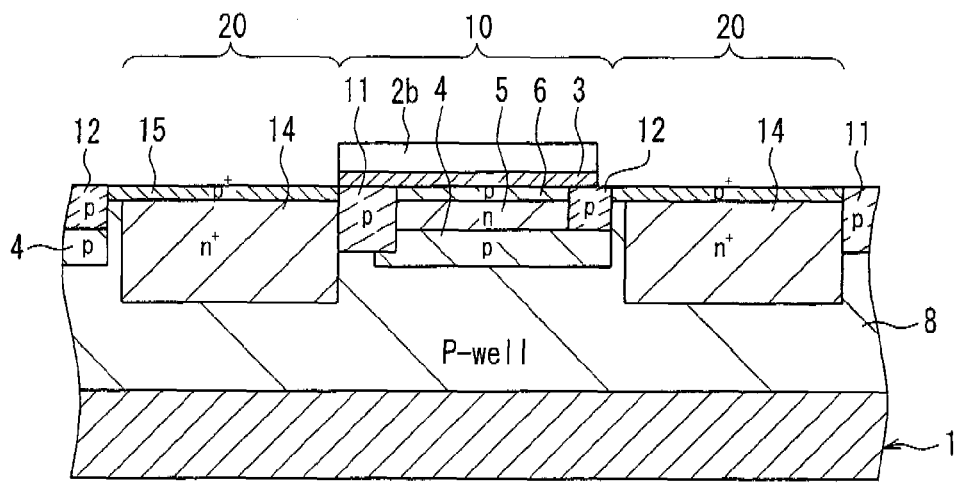

Next, a method for manufacturing the semiconductor device (the charge transfer device) according to Embodiment 1 of the present invention will be described with reference to FIGS. 5 and 6. FIGS. 5 and 6 are cross-sectional views showing the method for manufacturing the semiconductor device according to Embodiment 1 of the present invention. FIGS. 5A to 5C show a series of main manufacturing steps, and FIGS. 6A to 6C show a series of main manufacturing steps that are performed after the step shown in FIG. 5C.

In the description below, besides the method for manufacturing the semiconductor device 10 according to Embodiment 1, a method for manufacturing a solid-state imaging device provided with the semiconductor device 10 also will be described. Moreover, the cross-sections shown in FIGS. 5 and 6 are taken on line L-L' of FIG. 1, similarly to the cross-section shown in FIG. 3.

Firstly, as shown in FIG. 5A, a mask (not illustrated) for exposing a region to form the p-well 8 is provided on the semiconductor substrate 1, and thereafter, the p-type impurity is ion-implanted so as to form the p-well 8. Further, the mask for forming the p-well 8 is removed, a mask (not illustrated) for exposing a region to form the first semiconductor region 4 is provided on the semiconductor substrate 1, and thereafter, a p-type impurity is ion-implanted so as to form the p-type first semiconductor region 4. Subsequently, the mask for forming the first semiconductor region 4 is removed.

In the example of FIG. 5A, the p-well 8 and the first semiconductor region 4 are formed by ion-implanting boron (B). Moreover, it is preferable that, during the ion-implantation for forming the p-well 8, an acceleration energy is set in a range between 1000 keV and 3000 keV, and a dose is set in a range between $2 \times 10^{11}$ ions/cm$^2$ and $5 \times 10^{11}$ ions/cm$^2$. Further, it is preferable that, during the ion-implantation for forming the first semiconductor region 4, an acceleration energy is set in a range between 200 keV and 500 keV, and a dose is set in a range between $2 \times 10^{11}$ ions/cm$^2$ and $10 \times 10^{11}$ ions/cm$^2$.

Next, as shown in FIG. 5B, a mask (not illustrated) for exposing a region to form the element isolation region 11 is provided on the semiconductor substrate 1, and thereafter, the p-type impurity is ion-implanted so as to form the element isolation region 11. Further, the mask for forming the element isolation region 11 is removed, a mask (not illustrated) for exposing a region to form the element isolation region 12 is provided on the semiconductor substrate 1, and thereafter, the p-type impurity is ion-implanted so as to form the element isolation region 12. Subsequently, the mask for forming the element isolation region 12 is removed.

In the example of FIG. 5B, the element isolation regions 11 and 12 are formed by ion-implanting indium (In) having a speed of diffusion induced by heat that is lower than that of boron (B). Moreover, since the element isolation region 11 is a reading side, it is preferable that, during the ion-implantation for forming the element isolation region 11, an acceleration energy is set in a range between 1000 keV and 3000 keV, and a dose is set in a range between $1.5 \times 10^{12}$ ions/cm$^2$ and $5 \times 10^{12}$ ions/cm$^2$. Since the element isolation region 12 is a non-reading side, it is preferable that, during the ion-implantation for forming the element isolation region 12, an acceleration energy is set in a range between 300 keV and 1000 keV, and a dose is set in a range between $3 \times 10^{12}$ ions/cm$^2$ and $10 \times 10^{12}$ ions/cm$^2$.

Next, as shown in FIG. 5C, a mask (not illustrated) for exposing a region to form a plurality of the photoelectric conversion regions 14 is provided on the semiconductor substrate 1, and thereafter, the n-type impurity is ion-implanted so as to form the plurality of the photoelectric conversion regions 14. Further, the mask for forming the photoelectric conversion regions 14 is removed, a mask (not illustrated) for exposing a region to form the second semiconductor region 5 is provided on the semiconductor substrate 1, and thereafter, the n-type impurity is ion-implanted so as to form the second semiconductor region 5 serving as the channel portion of the CCD. Incidentally, the mask for forming the second semiconductor region 5 will be used also in a next step shown in FIG. 6A.

In the example of FIG. 5C, the photoelectric conversion regions 14 and the second semiconductor region 5 are formed by ion-implanting arsenic (As). Moreover, it is preferable that, during the ion-implantation for forming the photoelectric conversion regions 14, an acceleration energy is set in a range between 400 keV and 1000 keV, and a dose is set in a range between $3 \times 10^{12}$ ions/cm$^2$ and $8 \times 10^{12}$ ions/cm$^2$. Further, it is preferable that, during the ion-implantation for forming the second semiconductor region 5, an acceleration energy is set in a range between 80 keV and 200 keV, and a dose is set in a range between $3 \times 10^{12}$ ions/cm$^2$ and $8 \times 10^{12}$ ions/cm$^2$.

Next, as shown in FIG. 6A, in a state where the mask used in the step of FIG. 5C is left in place, the p-type impurity is ion-implanted into the semiconductor substrate 1 so as to form the p-type third semiconductor region 6 on the second semiconductor region 5. Thereafter, the mask is removed.

In the example of FIG. 6A, the third semiconductor region 6 is formed by ion-implanting indium (In) having a speed of diffusion induced by heat that is lower than that of boron (B). Moreover, it is preferable that, during the ion-implantation for forming the third semiconductor region 6, an acceleration energy is set in a range between 60 keV and 150 keV, and a dose is set in a range between $1 \times 10^{12}$ ions/cm$^2$ and $8 \times 10^{12}$ ions/cm$^2$, as described above.

Next, as shown in FIG. 6B, the insulation layer 3 is formed of a silicon oxide film (SiO$_2$) or the like on the region where the third semiconductor region 6 is formed, and the transfer electrode 2b is formed thereon. In the example of FIG. 6B, the insulation layer 3 is formed by forming an insulation film on the substrate surface of the semiconductor substrate 1, forming a resist pattern that is suitable for a shape of the insulation layer 3 by lithography applied onto the insulation film, and etching the insulation film. Moreover, the transfer electrode 2b is formed by developing a polysilicon film on the insulation layer 3, forming a resist pattern that is suitable for a shape of the transfer electrode 2b by lithography, and etching the polysilicon film.

The transfer electrodes 2a and 2c also are polysilicon electrodes similarly to the transfer electrode 2b, which are not shown in FIG. 6B. The transfer electrodes 2a and 2c are formed by forming the insulation layer 3 by oxidation of the transfer electrode 2b or deposition after the formation of the transfer electrode 2b of polysilicon, further forming a polysilicon film on the insulation layer 3 and etching the polysilicon film. Such an electrode structure is so-called a "polysilicon multi-layer electrode structure". It should be noted that the transfer electrodes 2a to 2c are not limited to the example described in Embodiment 1.

Next, as shown in FIG. 6C, the p-type impurity is ion-implanted using the transfer electrodes 2a to 2c and the insulation layer 3 as a mask so as to form the semiconductor region 15. In the example of FIG. 6C, the semiconductor region 15 also is formed by ion-implanting indium (In) having a speed of diffusion induced by heat that is lower than that of boron (B). Moreover, it is preferable that, during the ion-implantation for forming the semiconductor region 15, an acceleration energy is set in a range between 60 keV and 200 keV, and a dose is set in a range between $5 \times 10^{12}$ ions/cm$^2$ and $8 \times 10^{12}$ ions/cm$^2$.

Thereafter, an insulation layer and a metal wiring that are not illustrated are formed, thereby completing the solid-state imaging device. Moreover, after the ion-implantation in each step described above, annealing preferably is carried out, which is not illustrated. The reason for this is because, in the case of carrying out the annealing, the diffusion of the implanted impurity can be suppressed further. Examples of a specific method for the annealing include RTA (Rapid Thermal Anneal) by irradiating the semiconductor substrate with electromagnetic waves such as heat rays and laser beams for a short period of time so as to heat it.

In Embodiment 1, the example where the semiconductor substrate 1 is the n-type silicon substrate was described, but the present invention is not limited to this, and also can be applied to a case where the semiconductor substrate is a p-type silicon substrate. Also in this case, the effects of the present invention can be obtained, similarly to the example of Embodiment 1. Further, in this case, the conductivity types of the first semiconductor region 4 and the third semiconductor region 6 are n-type, and the conductive type of the second semiconductor region 5 is p-type.

Embodiment 2

Next, a semiconductor device according to Embodiment 2 of the present invention and a method for manufacturing the semiconductor device will be described with reference to FIGS. 7 and 8. The semiconductor device according to Embodiment 2 is a buried channel-type MOS transistor.

Figure 7A:
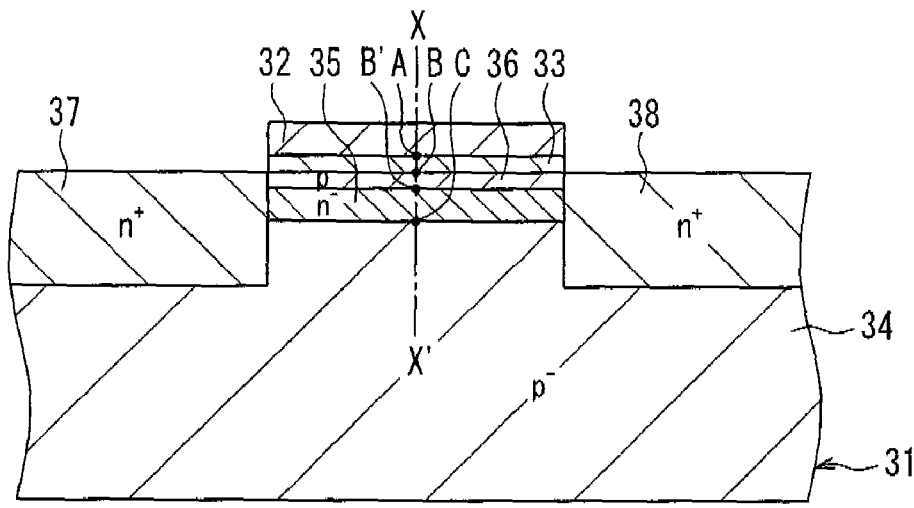
FIG. 7A is a cross-sectional view schematically showing a structure of the semiconductor device according to Embodiment 2 of the present invention.

Firstly, a structure of the semiconductor device according to Embodiment 2 will be described with reference to FIG. 7. FIG. 7 is a view showing the semiconductor device according to Embodiment 2 of the present invention. FIG. 7A is a cross-sectional view schematically showing the structure of the semiconductor device according to Embodiment 2 of the present invention, and FIG. 7B is a view showing an electric potential distribution of the semiconductor device shown in FIG. 7A.

Figure 7B:
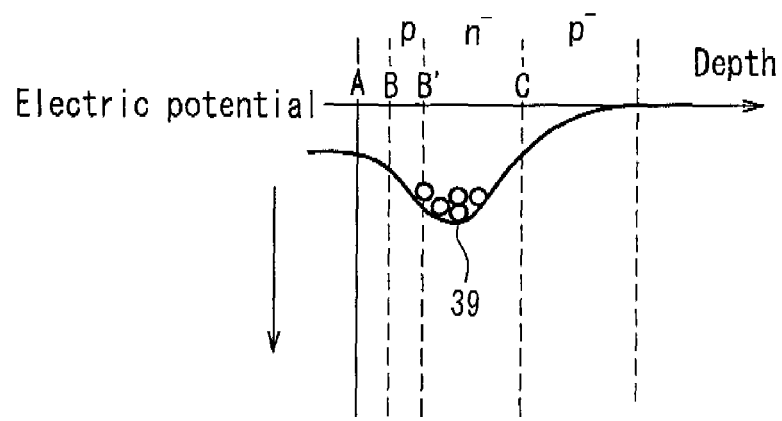
FIG. 7B is a view showing an electric potential distribution of the semiconductor device shown in FIG. 7A.

In addition, the electric potential distribution shown in FIG. 7B is taken on line X-X' of FIG. 7A. Points A, B, B' and C in FIG. 7B correspond to points A, B, B' and C on line X-X' shown in FIG. 7A, respectively.

As shown in FIG. 7A, the semiconductor device (the buried channel-type MOS transistor) according to Embodiment 2 has a structure where a gate electrode 32 is disposed on a semiconductor substrate 31 via a gate insulation film 33. In Embodiment 2, the semiconductor substrate 31 is a p-type silicon substrate, and a p-type first semiconductor region 34 is formed in the semiconductor substrate 31.

Moreover, the semiconductor substrate 31 is provided with a n-type second semiconductor region 35 and a p-type third semiconductor region 36 in a position that overlaps a region of the semiconductor substrate 31 directly underneath the gate electrode 32. The first semiconductor region 34 also is in a position that overlaps the region of the semiconductor substrate 31 directly underneath the gate electrode 32.

The second semiconductor region 35 is formed on the first semiconductor region 34, and functions as a channel portion of the buried channel-type MOS transistor. Thus, in the semiconductor device shown in FIG. 7A, a channel is formed even when the voltage applied to the gate electrode 32 is 0 V. Moreover, the third semiconductor region 36 is formed on the second semiconductor region 35. Further, in the semiconductor substrate 31, a semiconductor region 37 serving as a source and a semiconductor region 38 serving as a drain are formed so as to sandwich the second semiconductor region 35 and the third semiconductor region 36.

Figure 10A:
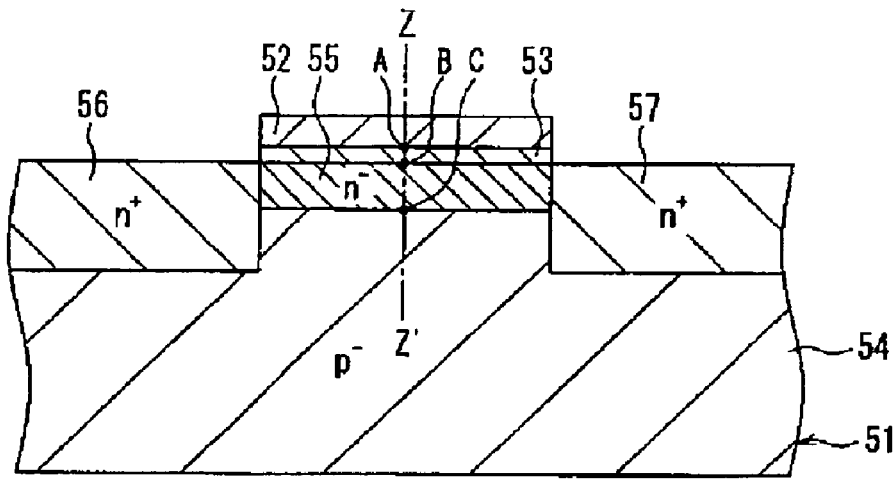
FIG. 10A is a cross-sectional view schematically showing a structure of the conventional buried channel-type MOS transistor.
Figure 10B:
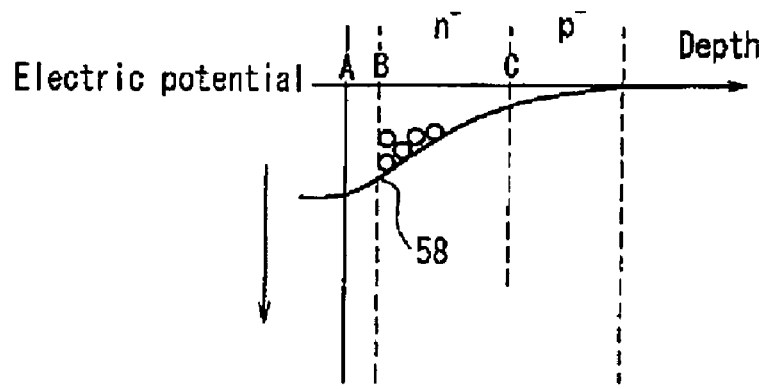
FIG. 10B is a view showing an electric potential distribution of the buried channel-type MOS transistor shown in FIG. 10A.

Here, the semiconductor device of the conventional example shown in FIG. 10 in Background Art and the semiconductor device of Embodiment 2 will be compared. As shown in FIGS. 7 and 10, also in Embodiment 2, the third semiconductor region 36 that does not exist in the conventional example is formed as a surface layer of the semiconductor substrate 31, similarly to Embodiment 1. Moreover, a conductivity type of the third semiconductor region 36 is a conductivity type opposite to the conductivity type of the second semiconductor region 35.

Thus, also in Embodiment 2, when applying a voltage to the gate electrode 32 and depleting the second semiconductor region 35 and the third semiconductor region 36, a position of a maximal point 39 of electric potential in the second semiconductor region 35 is deeper than that of the conventional example in which the third semiconductor region 36 does not exist (see FIG. 10).

Thus, unlike the conventional example, an electric charge is accumulated in a position that is away from an interface (the point B) between the semiconductor substrate 31 and the gate insulation film 33, and is transferred without being in contact with the interface. Therefore, according to Embodiment 2, the generation of noises while driving the buried channel-type MOS transistor can be suppressed more than that of the conventional example.

Also in Embodiment 2, similarly to Embodiment 1, in order to increase a depth of the position of the maximal point 39 (see FIG. 7B) of the electric potential in the second semiconductor region 35 more than that of the conventional example, it is necessary to secure a certain impurity density in the third semiconductor region 36. Thus, it is preferable to introduce the impurity by ion-implantation for forming the third semiconductor region 36. Further, it is preferable that, during the ion-implantation, an acceleration energy is set in a range between 50 keV and 200 keV, and a dose is set in a range between $5\times10^{11}$ ions/cm$^2$ and $8\times10^{12}$ ions/cm$^2$, for example. Moreover, since the semiconductor device according to Embodiment 2 is the buried channel-type MOS transistor, it is particularly preferable that the acceleration energy is set in a range between 60 keV and 150 keV, and the dose is set in a range between $1\times10^{12}$ ions/cm$^2$ and $8\times10^{12}$ ions/cm$^2$ during the ion-implantation.

Further, in Embodiment 2, since the semiconductor device is the buried channel-type MOS transistor, the second semiconductor region 35 is formed so as to have a density that is lower than the density of the second semiconductor region 5 shown in FIG. 2 in Embodiment 1. Thus, in Embodiment 2, an impurity in the third semiconductor region 36 is more likely to be diffused into the second semiconductor region 35 by heat generated in the process of manufacturing the semiconductor device 10, compared with the case of Embodiment 1.

Thus, also in Embodiment 2, the third semiconductor region 36 is preferably formed by using, as the impurity, the materials, for example, indium (In), gallium (Ga) and thallium (Tl) that have relatively large atomic radiuses and have low speeds of diffusion induced by heat. Moreover, also in Embodiment 2, the ion-implantation of the impurity such as indium (In), gallium (Ga) and thallium (Tl) during the formation of the third semiconductor region 36 may be carried out by ionizing the impurity into a monovalent ion or a bivalent ion.

Moreover, also in Embodiment 2, the diffusion of the n-type impurity by heat preferably is suppressed in the n-type second semiconductor region 35. The reason for this is because, similarly to the case of Embodiment 1, even if the diffusion of the p-type impurity by heat is suppressed, when the n-type impurity is diffused significantly by the heat, a diffusion depth (that is, xj) is increased, which causes a problem in that channel electric potential is increased so as to prevent a normal operation, and as a result, the function as the buried channel-type MOS transistor is degraded. Thus, it is preferable to use, also as the n-type impurity, a material that has a relatively large atomic radius and has a low speed of diffusion induced by heat. For example, arsenic (As) may be used.

Next, the method for manufacturing the semiconductor device (the buried channel-type MOS transistor) according to Embodiment 2 of the present invention will be described with reference to FIG. 8. FIG. 8 is a cross-sectional view showing the method for manufacturing the semiconductor device according to Embodiment 2 of the present invention, and FIGS. 8A to 8D show a series of main manufacturing steps.

Figure 8A:
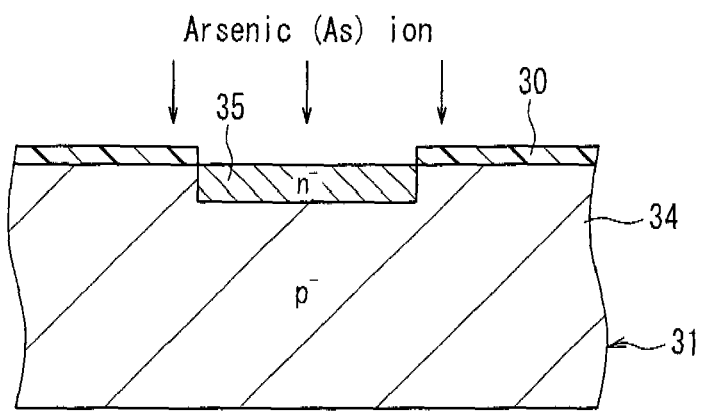
FIGS. 8A to 8D show a series of main manufacturing steps.

Firstly, as shown in FIG. 8A, a mask 30 for exposing a region to form the second semiconductor region 35 is provided on the semiconductor substrate (the p-type silicon substrate) 31 in which the p-type region 34 is formed, and thereafter the n-type impurity is ion-implanted, thereby forming the n-type second semiconductor region 35.

In the example of FIG. 8A, the second semiconductor region 35 is formed by ion-implanting arsenic (As). Moreover, it is preferable that, during the ion-implantation for forming the second semiconductor region 35, an acceleration energy is set in a range between 30 keV and 200 keV, and a dose is set in a range between $5\times10^{11}$ ions/cm$^2$ and $15\times10^{11}$ ions/cm$^2$.

Figure 8B:
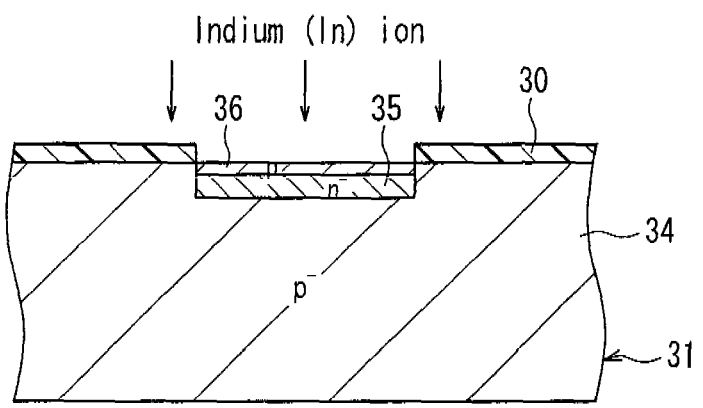

Next, as shown in FIG. 8B, in a state where the mask 30 is left in place, the p-type impurity is ion-implanted into the semiconductor substrate 31 so as to form the p-type third semiconductor region 36 on the second semiconductor region 35. Thereafter, the mask 30 is removed.

In the example of FIG. 8B, the third semiconductor region 36 is formed by ion-implanting indium (In) having a speed of diffusion induced by heat that is lower than that of boron (B). Moreover, it is preferable that, during the ion-implantation for forming the third semiconductor region 36, an acceleration energy is set in a range between 60 keV and 150 keV, and a dose is set in a range between $1\times10^{12}$ ions/cm$^2$ and $8\times10^{12}$ ions/cm$^2$, as described above.

Figure 8C:
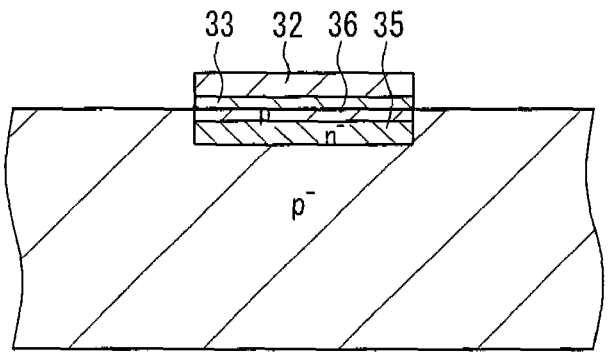

Next, as shown in FIG. 8C, the gate insulation film 33 and the gate electrode 32 are formed on a region of the semiconductor substrate 31 where the third semiconductor region 36 is formed. More specifically, an insulation film is formed on a substrate surface of the semiconductor substrate 31, a polysilicon film is formed on the insulation film, a resist pattern subsequently is formed by lithography, and the polysilicon film and the insulation film are etched.

Figure 8D:
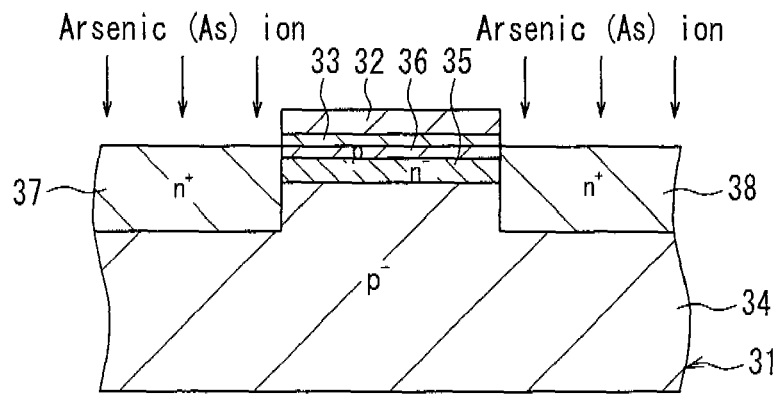

Next, as shown in FIG. 8D, the n-type impurity is ion-implanted using the gate insulation film 33 and the gate electrode 32 as a mask so as to form the semiconductor region 37 serving as the source and the semiconductor region 38 serving as the drain. In the example of FIG. 8D, the semiconductor regions 37 and 38 are formed by ion-implanting arsenic (As). Moreover, it is preferable that, during the ion-implantation for forming the semiconductor regions 37 and 38, an acceleration energy is set in a range between 10 keV and 50 keV, and a dose is set in a range between $1\times10^{15}$ ions/cm$^2$ and $5\times10^{15}$ ions/cm$^2$.

Thereafter, an insulation layer and a metal wiring that are not illustrated are formed, thereby completing the buried channel-type MOS transistor. Moreover, also in Embodiment 2, similarly to Embodiment 1, annealing preferably is carried out after the ion-implantation in each step described above.

In Embodiment 2, the example where the semiconductor substrate 31 is the p-type silicon substrate was described, but the present invention is not limited to this, and can be applied also to a case where the semiconductor substrate is a n-type silicon substrate. Also in this case, the effects of the present invention can be obtained, similarly to the example of Embodiment 2.

INDUSTRIAL APPLICABILITY

The present invention can be applied to a semiconductor device such as a charge transfer device represented by a CCD and a MOS transistor, and also can be applied to a method for manufacturing such a semiconductor device.

The invention claimed is:

1. A solid-state imaging device comprising: a photodiode provided in a semiconductor substrate; and a transfer electrode provided on the semiconductor substrate via an insulation layer, wherein
the semiconductor substrate comprises: a first semiconductor region of a first conductivity type formed with a first impurity; a second semiconductor region of a conductivity type opposite to the first conductivity type; and a third semiconductor region of the first conductivity type in a position that overlaps a region of the semiconductor substrate directly underneath the transfer electrode,
the second semiconductor region is formed on the first semiconductor region as a channel portion that reads out an electric charge generated in the photodiode, and
the third semiconductor region is a p-type region formed on the second semiconductor region, in a vicinity of an interface between the semiconductor substrate and the insulation layer by using a second impurity of at least one material selected from the group consisting of indium, gallium and thallium, each having a larger atomic radius and having a lower speed of diffusion induced by heat in comparison with, those of the first impurity,
wherein the solid-state imaging device has a buried channel-type MOS transistor, and
the second impurity is carried out by ion-implantation, and an acceleration energy is set in a range between 60 keV and 150 keV, and a dose is set in a range between $1\times10^{12}$ ions/cm$^2$ and $8\times10^{12}$ ions/cm$^2$, during the ion-implantation.

2. The solid-state imaging device according to claim 1, wherein the second semiconductor region is a n-type region in which arsenic is introduced.

3. The solid-state imaging device according to claim 1, wherein the first semiconductor region is formed by using, as the impurity, a material that has a low speed of diffusion induced by heat.

4. The solid-state imaging device according to claim 3, wherein the first semiconductor region is a p-type region in which indium is introduced.

5. The solid-state imaging device according to claim 1, further comprising a fourth semiconductor region of a first conductivity type on the surface of the photodiode,
an impurity to be introduced into the fourth semiconductor region has a larger atomic radius and has a lower speed of diffusion induced by heat in comparison with those of the first impurity.

6. A method for manufacturing a solid-state imaging device comprising: a photodiode provided in a semiconductor substrate; and a transfer electrode provided on the semiconductor substrate via an insulation layer,
the method at least comprising:
(a) a step of introducing an impurity of a first conductivity type into a region that overlaps a region on the semiconductor substrate directly underneath the transfer electrode so as to form a first semiconductor region;
(b) a step of introducing an impurity of a conductivity type opposite to the first conductivity type into a region that overlaps a region on the first semiconductor region directly underneath the transfer electrode so as to form a second semiconductor region serving as a channel portion that reads out an electric charge generated in the photodiode; and
(c) a step of introducing an impurity of the first conductivity type into a vicinity of an interface between the semiconductor substrate and the insulation layer in a region that overlaps a region on the second semiconductor region directly underneath the transfer electrode so as to form a third semiconductor region,
wherein the solid-state imaging device has a buried channel-type MOS transistor, and
wherein the step (c) forms a p-type region by introducing at least one of indium, gallium and thallium as the impurity of the first conductivity type which is carried out by ion-implantation, and
an acceleration energy is set in a range between 60 keV and 150 keV, and a dose is set in a range between $1\times10^{12}$ ions/cm$^2$ and $8\times10^{12}$ ions/cm$^2$, during the ion-implantation.

7. The method for manufacturing a solid-state imaging device according to claim 6, wherein the impurity of the first conductivity type in the step (c) is at least one of indium, gallium and thallium.

8. The method for manufacturing a solid-state imaging device according to claim 6, wherein, in the ion-implantation in the step (c), the impurity is ionized into a bivalent ion.

9. The method for manufacturing a solid-state imaging device according to claim 6, wherein, in the ion-implantation in the step (c), the impurity is ionized into a monovalent ion.

10. The method for manufacturing a solid-state imaging device according to claim 6, wherein the impurity of the conductivity type opposite to the first conductivity type in the step (b) is arsenic.

11. The method for manufacturing a solid-state imaging device according to claim 6, further comprising a step of heating the semiconductor substrate after the ion-implantation in the step (c).

12. The method for manufacturing a solid-state imaging device according to claim 6, further comprising a step (d) of forming a fourth semiconductor region by introducing an impurity of a first conductivity type on the surface of the photodiode, the impurity of the first conductivity type used in the step (d) has a larger atomic radius and has a lower speed of diffusion induced by heat in comparison with those of the impurity of the first conductivity type used in the step (a).

13. A semiconductor device comprising a MOS transistor provided in a semiconductor substrate, the MOS transistor having a gate electrode provided on the semiconductor substrate via an insulation layer, wherein the semiconductor substrate comprises: a first semiconductor region of a first conductivity type formed with a first impurity; a second semiconductor region of a conductivity type opposite to the first conductivity type; and a third semiconductor region of the first conductivity type in a position that overlaps a region of the semiconductor substrate directly underneath the gate electrode, the second semiconductor region is formed on the first semiconductor region as a channel portion in the MOS transistor, the third semiconductor region is a p-type region formed on the second semiconductor region, in a vicinity of an interface between the semiconductor substrate and the insulation layer by using a second impurity of at least one material selected from the group consisting of indium, gallium and thallium, each having a larger atomic radius and having a lower speed of diffusion induced by heat in comparison with those of the first impurity, and a semiconductor region serving as a source region of the MOS transistor and a semiconductor region serving as a drain are formed in positions that are adjacent to the second semiconductor region and the third semiconductor region, wherein the solid-state imaging device has a buried channel-type MOS transistor, and the second impurity is carried out by ion-implantation, and an acceleration energy is set in a range between 60 keV and 150 keV, and a dose is set in a range between $1 \times 10^{12}$ ions/cm$^2$ and $8 \times 10^{12}$ ions/cm$^2$, during the ion-implantation.

14. The semiconductor device according to claim 13, wherein the third semiconductor region is a p-type region in which at least one of indium, gallium and thallium is introduced.

15. The semiconductor device according to claim 13, wherein the second semiconductor region is a n-type region in which arsenic is introduced.

16. The semiconductor device according to claim 13, wherein the first semiconductor region is formed by using, as an impurity, a material that has a low speed of diffusion induced by heat.

17. The semiconductor device according to claim 16, wherein the first semiconductor region is a p-type region in which indium is introduced.

18. The solid-state imaging device according to claim 13, wherein a maximal point of electric potential of the channel portion exists in the second semiconductor region.

* * * * *